(12) United States Patent
Mookken

(10) Patent No.: US 12,255,124 B2
(45) Date of Patent: Mar. 18, 2025

(54) JET IMPINGEMENT COOLING WITH BYPASS FLUID PORTION FOR HIGH POWER SEMICONDUCTOR DEVICES

(71) Applicant: SEMICONDUCTOR COMPONENTS INDUSTRIES, LLC, Phoenix, AZ (US)

(72) Inventor: John Mookken, Scottsdale, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 219 days.

(21) Appl. No.: 18/167,998

(22) Filed: Feb. 13, 2023

(65) Prior Publication Data

US 2024/0047304 A1    Feb. 8, 2024

Related U.S. Application Data

(60) Provisional application No. 63/370,389, filed on Aug. 4, 2022.

(51) Int. Cl.
*H01L 23/473* (2006.01)

(52) U.S. Cl.
CPC .................. *H01L 23/4735* (2013.01)

(58) Field of Classification Search
CPC .................................................. H01L 23/4735
See application file for complete search history.

(56) References Cited

U.S. PATENT DOCUMENTS

| | | | |
|---|---|---|---|
| 5,270,572 A | 12/1993 | Nakajima et al. | |
| 7,184,269 B2* | 2/2007 | Campbell | H05K 7/2079 |
| | | | 174/15.1 |
| 9,903,664 B2 | 2/2018 | Joshi | |
| 11,600,550 B2* | 3/2023 | Galloway | H01L 23/4735 |
| 2021/0159148 A1* | 5/2021 | Egger | H05K 7/20927 |

FOREIGN PATENT DOCUMENTS

| | | | |
|---|---|---|---|
| DE | 102018208977 A1 | 12/2019 | |
| EP | 3836204 A1 * | 6/2021 | B60L 50/51 |
| JP | 2016189414 A | 11/2016 | |

OTHER PUBLICATIONS

Search Report for counterpart German Patent Application No. 10 2023 119 544.1, dated Jan. 30, 2024, 7 pages.

* cited by examiner

*Primary Examiner* — Mukundbhai G Patel
(74) *Attorney, Agent, or Firm* — Brake Hughes Bellermann LLP

(57) ABSTRACT

A jet impingement cooling assembly for semiconductor devices includes an inlet chamber configured to receive an inlet fluid flow, and a jet plate having a plurality of jet nozzles formed therein and coupled to the inlet chamber, and positioned to direct a jet fluid portion of the inlet fluid flow from the inlet chamber through the jet nozzles. The jet impingement cooling assembly may further include an outlet chamber positioned to receive the jet fluid portion once the jet fluid portion has passed through the jet nozzles, and at least one bypass nozzle in fluid connection with the inlet chamber and configured to direct a bypass fluid portion of the inlet fluid flow into the outlet chamber with the jet fluid portion to thereby define an outlet fluid flow.

20 Claims, 9 Drawing Sheets

|  |  | Bypass Flow parameters | | |
| --- | --- | --- | --- | --- |
| Thermal resistance | Pressure Drop | 808<br># Bypass nozzles | 810<br>Diameter | 812<br>Inlet flow |
| Y | ~55X | N | Z | 10 |
| ~1.2Y | ~4X | N | 2Z | 10 |
| ~1.8Y | X | N | 3Z | 10 |
| Y | ~35X | N | Z | 8 |
| ~1.3Y | ~10X | N | 2Z | 8 |
| ~2Y | X | N | 3Z | 8 |

FIG. 8

JET IMPINGEMENT COOLING WITH BYPASS FLUID PORTION FOR HIGH POWER SEMICONDUCTOR DEVICES

CROSS-REFERENCE TO RELATED APPLICATION

This application claims the benefit of and priority to U.S. Provisional Application No. 63/370,389, filed Aug. 4, 2022, which is incorporated by reference herein in its entirety.

TECHNICAL FIELD

This description relates to cooling techniques for semiconductor devices.

BACKGROUND

High power semiconductor devices, during operation, generate heat that may be harmful to the devices themselves, or to nearby components. For example, excess heat may cause an abrupt device breakdown, or may contribute to shortening of a device lifetime.

To mitigate such potential difficulties, liquid cooling systems may be used to cool high power semiconductor devices. For example, a pump may be used to direct a flow of water or other suitable cooling liquid to high-heat areas, to thereby facilitate heat transfer from the high-heat areas to the cooling liquid.

Such liquid cooling systems, however, may be costly, complex, and prone to failure or underperformance. Consequently, liquid cooling systems have not been widely adopted.

SUMMARY

According to one general aspect, a jet impingement cooling assembly for semiconductor devices may include an inlet chamber configured to receive an inlet fluid flow, and a jet plate having jet nozzles formed therein and coupled to the inlet chamber, and positioned to direct a jet fluid portion of the inlet fluid flow from the inlet chamber through the jet nozzles. The jet impingement cooling assembly may include an outlet chamber positioned to receive the jet fluid portion once the jet fluid portion has passed through the jet nozzles, and at least one bypass nozzle in fluid connection with the inlet chamber and configured to direct a bypass fluid portion of the inlet fluid flow into the outlet chamber with the jet fluid portion to thereby define an outlet fluid flow.

According to another general aspect, a jet plate assembly for jet impingement cooling of a semiconductor device may include a jet plate having jet nozzles and at least one bypass nozzle formed therein, and configured to be received within a heat exchange base. The jet plate, when received within the heat exchange base, may divide a fluid flow path of an inlet fluid flow received at an inlet chamber of the heat exchange base into a jet fluid portion passing through the plurality of jet nozzles into an outlet chamber of the heat exchange base, and a bypass fluid portion passing through the at least one bypass nozzle into the outlet chamber, to thereby define an outlet fluid flow that includes the bypass fluid portion and the jet fluid portion.

According to another general aspect, a method of making a jet impingement cooling assembly for semiconductor devices may include forming an inlet chamber configured to receive an inlet fluid flow, and forming a jet plate having a plurality of jet nozzles formed therein and coupled to the inlet chamber, and positioned to direct a jet fluid portion of the inlet fluid flow from the inlet chamber through the jet nozzles. The method may further include forming an outlet chamber positioned to receive the jet fluid portion once the jet fluid portion has passed through the jet nozzles, and forming at least one bypass nozzle in fluid connection with the inlet chamber and configured to direct a bypass fluid portion of the inlet fluid flow into the outlet chamber with the jet fluid portion to thereby define an outlet fluid flow.

The details of one or more implementations are set forth in the accompanying drawings and the description below. Other features will be apparent from the description and drawings, and from the claims.

BRIEF DESCRIPTION OF THE DRAWINGS

FIG. 8 illustrates a table demonstrating example pressures and thermal responses for various example implementations of the jet impingement cooling assembly of FIG. 1.

DETAILED DESCRIPTION

Figure 1:
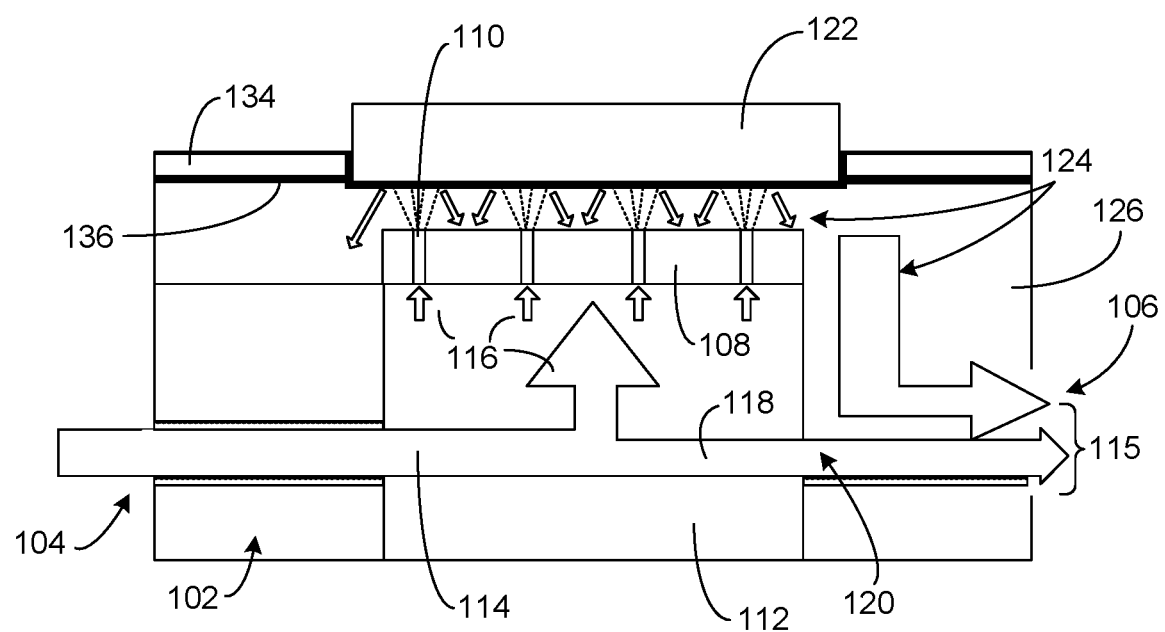
FIG. 1 is an example cross-sectional side view of a jet impingement cooling assembly for high power semiconductor devices with a bypass fluid portion.

As described in detail below, embodiments include a heat exchange assembly for performing jet impingement cooling of semiconductor power modules. Such jet impingement cooling may be used to improve a thermal performance of the semiconductor power modules, including, e.g., improving an output power in traction inverters of electric vehicles, as described in more detail, below.

In many scenarios, it is desirable to implement jet impingement cooling by leveraging an existing fluid flow. For example, in example automotive contexts just referenced, it may occur that various automotive components (e.g., a motor and/or a battery) require a fluid flow for one or more related cooling systems. Such a fluid flow may require one or more pumps and associated components, and may have a fluid volume and/or fluid pressure required to perform desired cooling of such automotive components.

In such contexts, it is often undesirable and/or infeasible to provide a separate fluid flow dedicated to jet impingement cooling. For example, cost and/or space constraints may prevent the addition of a separate set of fluid pump(s) and associated components.

In the context of semiconductor power modules, however, it may be necessary to cool a number and variety of relatively small semiconductor chips. Moreover, relevant thermal ranges may be different for different ones of the semiconductor chips, and/or different than those of the larger automotive components being cooled.

Further, fluid flow that is suitable for larger scale automotive components may not be suitable for cooling semiconductor power modules, even when jet impingement cooling is available. For example, a pressure or velocity of fluid being emitted by a jet nozzle onto the semiconductor power modules may be excessive, and may lead to undesired effects, such as an erosion of a metal or metal coating that may be on the semiconductor power module.

Additionally, inserting a jet impingement cooling system into an existing fluid-based cooling system may introduce an excessive and undesirable pressure drop into the system. Such a pressure drop may be problematic for other components being cooled, and/or may require compensatory components (e.g., a larger or more expensive fluid pump) to be included.

In example implementations, therefore, a fluid bypass is provided, in which an inlet fluid flow is partially diverted so that a first or jet fluid portion is directed to cool the semiconductor power module(s), while a second or bypass fluid portion flows essentially unimpeded through the heat exchange assembly. Accordingly, the fluid bypass may cause the jet fluid portion of the inlet fluid flow to have a reduced velocity when impinging upon the semiconductor power modules. Moreover, the fluid bypass may result in a lower pressure drop for a given level of thermal performance, as compared to conventional jet impingement cooling systems.

Thus, by providing the described fluid bypass, a lifetime of the semiconductor power modules and/or related packaging may be extended, a thermal performance of a jet impingement cooling system may be improved, and a reliability of the semiconductor power modules and the jet impingement cooling system may be improved. Moreover, the fluid bypass may be customized, so that desired ranges of cooling and associated thermal performance(s) may be achieved.

For example, conventional jet impingement cooling systems may include components (e.g., heat exchange assembly components) that are made primarily or entirely using metal. Semiconductor power modules may be fastened within such conventional jet impingement cooling systems using available o-rings, gaskets, and fasteners.

Such conventional jet impingement cooling systems may be complex and costly to manufacture, and may suffer from poor reliability. For example, the o-ring seals may result in points of failure for the fluid flow, particularly for the types of high-pressure, high-velocity fluid flows typically present in conventional cooling systems.

In example implementations, however, polymers may be used to construct heat exchange assembly components. For example, such polymer components may be provided using injection molding techniques, and/or 3D printing techniques.

Such approaches reduce a cost and complexity of manufacturing jet impingement cooling systems. In addition, use of such polymers enable use of adhesives as a seal(s) in the jet impingement cooling systems, because, e.g., such adhesives may be effective in bonding the polymer of a heat exchange assembly to an epoxy or other molding of semiconductor power modules. Thus, described techniques may be used to replace the costly, complex, and/or error-prone o-rings, gaskets, and fasteners of conventional systems, thereby reducing cost (including costs of material and assembly), simplifying manufacturability, improving reliability, and generally facilitating adoption and use of jet impingement cooling systems for semiconductor power modules.

FIG. 1 is an example cross-sectional side view of a jet impingement cooling assembly for high power semiconductor devices with a bypass fluid portion. In FIG. 1, a heat exchange base 102 (which may be referred to, or include, a water jacket or cooling jacket) includes an inlet connection 104, which may be in fluid contact with a fluid pump (not illustrated in FIG. 1) to receive an inlet fluid flow 114. The heat exchange base 102 also includes an outlet connection 106, which may be part of a fluid loop that returns an outlet fluid flow 115 to the fluid pump. That is, as referenced above, the heat exchange base 102 for jet impingement cooling may be only part of a fluid loop used within a larger setting (e.g., within an automobile or other vehicle) to provide fluid-based heat dissipation to multiple components.

A jet plate 108 may be positioned within the heat exchange base 102. Multiple jet nozzles 110 may be formed within the jet plate 108. The jet plate 108 may be sealed to an inlet chamber 112, e.g., using an adhesive, as described herein. In some examples, the jet plate 108 may be mounted to the inlet chamber 112 and interchangeable with other jet plates having different configurations. In other implementations, the jet plate 108 may be formed integrally with the inlet chamber (e.g., using injection molding or 3D printing techniques).

The inlet fluid flow 114, such as a water flow, may be maintained through the inlet connection 104 and into the inlet chamber 112. Within the inlet chamber 112, the inlet fluid flow 114 is divided into a jet fluid portion 116 and a bypass fluid portion 118.

As shown in FIG. 1, the jet fluid portion 116 is directed through the jet nozzles 110. For the sake of clarity of description, the jet fluid portion is referred to as jet fluid portion 116 within the inlet chamber 112, and as jet fluid portion 124 after passing through the jet nozzles 110 and entering an outlet chamber 126.

Meanwhile, the bypass fluid portion 118 is directed through at least one bypass nozzle 120. Upon exiting the bypass nozzle 120, the bypass fluid portion 118 rejoins the jet fluid portion 124 and forms a total outlet fluid flow 115.

The jet nozzle 110 provides a vent, gap, or opening through which the pressurized inlet fluid flow 114, flowing through the inlet connection 104, is forced, to provide the high-speed fluid flow of the jet fluid portion 124 within the outlet chamber 126. The jet nozzles 110 may be sized, spaced, and positioned in any suitable or desired fashion on the jet plate 108. The jet nozzles 110 may be any desired and suitable shape, such as, e.g., circular, or ellipsoidal. The jet nozzles 110 may be formed within the jet plate 108, as shown, or may be attached or otherwise positioned at least partially on the jet plate 108, e.g., using a separate jet nozzle structure, which itself may have a desired and suitable width, length, and height.

Thus, the jet plate 108 forms a sealed connection with the inlet chamber 112, so that the jet fluid portion 116 of the inlet fluid flow 114 received by way of the inlet connection 104 is forced through the jet nozzles 110 to provide jet fluid portion 124. Accordingly, the jet fluid portion 124 may be impinged upon a semiconductor power module 122, in order to dissipate heat generated by operations of the semiconductor power module 122.

The semiconductor power module 122 may be mounted to the heat exchange base 102 using a mounting member 134. For example, the semiconductor power module 122 may include at least one semiconductor device with a frontside facing away from the inlet chamber 112 and a backside facing the jet plate 108.

In example implementations, as described and illustrated in more detail in various examples, below, the semiconductor power module 122 may be sealed using an appropriate adhesive 136 to the mounting member 134, and the mounting member 134 may be sealed using the same or different adhesive to a surface of the heat exchange base 102.

The semiconductor power module 122 may include a circuit board or other assembly of a plurality of semiconductor chips, or other devices. The various semiconductor power module devices may have heat signatures that range from high to negligible. Some semiconductor power module devices may be in close proximity to one another, which may exacerbate a need for heat dissipation, as compared to the need for heat dissipation of each of the individual semiconductor power module devices in isolation.

As referenced above, and illustrated in FIG. 1, the heat exchange base 102 is configured to receive the semiconductor power module 122, so that the jet nozzles 110 may be positioned to be directly below devices of the semiconductor power module 122. Consequently, the inlet fluid flow 114 from the inlet connection 104 may be divided into the jet fluid portion 116 and the bypass fluid portion 118, with the jet fluid portion 116 thereby being forced through the jet nozzles 110 to impinge directly onto corresponding backsides of devices of the semiconductor power module 122. Such an approach provides highly-efficient and direct cooling of the devices of the semiconductor power module 122.

Following this jet impingement onto the devices of the semiconductor power module 122, the jet fluid portion 124 may flow directly into the outlet chamber 126, or may proceed through included fluid-return channels (not visible in FIG. 1, but with examples provided below in the context of FIG. 7). As illustrated in FIG. 1, the jet fluid portion 124 may proceed into the outlet chamber 126 and rejoin with the bypass fluid portion 118 directed through the bypass nozzle 120, to thereby provide a total outlet fluid flow 115 through the outlet connection 106. In this way, the outlet fluid flow 115 may thereby be provided to other elements being cooled, and ultimately return to the fluid pump being used.

In described implementations, use of the bypass nozzle 120 and the bypass fluid portion may enable a degree of control over a velocity of the jet fluid portion 116/124, as well as control over a pressure drop across the jet impingement cooling system. For example, the bypass fluid portion 118 may be virtually any desired percentage of the inlet fluid flow 114 (e.g., may be 5%-50% of the inlet fluid flow 114). Consequently, the jet fluid portion 116 may include any remaining percentage of the inlet fluid flow not diverted to be included in the bypass fluid portion 118.

As a result, a velocity of the jet fluid portion 116/124 may be reduced or increased by corresponding increases/reductions in the bypass fluid portion 118. As noted above, the semiconductor power module 122 may have a metal, e.g., a metal coating (not shown in FIG. 1) provided at an impingement surface facing the jet nozzles 110, which may be eroded by high-velocity jet impingement fluid flows in conventional systems. Thus, the example of FIG. 1 illustrates that described techniques may be used to obtain a desired trade-off between, e.g., fluid velocities, heat transfer, pressure drops, and metal coating erosion.

Figure 2:
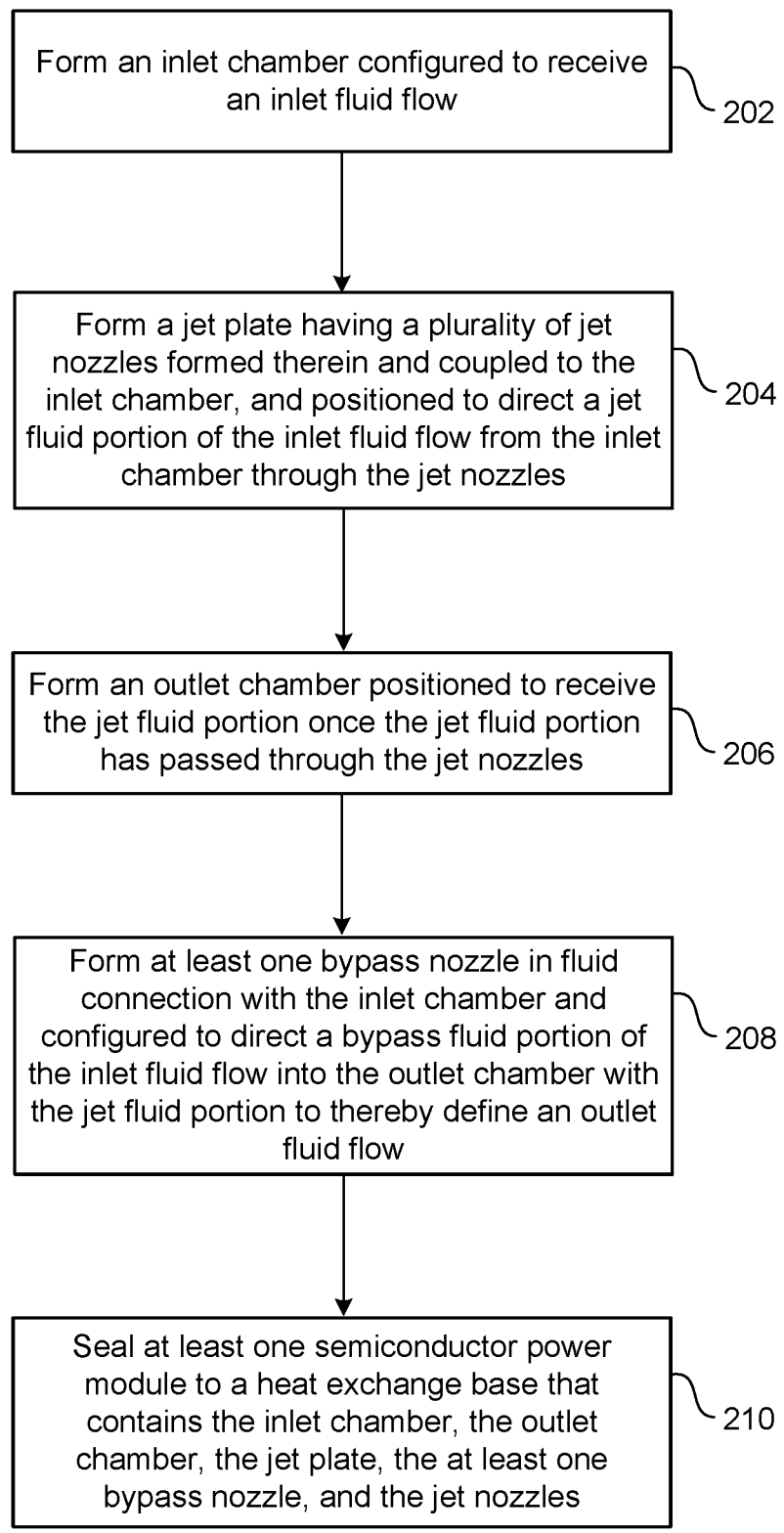
FIG. 2 is a flowchart illustrating an example manufacturing process for making a jet impingement cooling assembly, in accordance with example embodiments described herein.

FIG. 2 is a flowchart illustrating an example manufacturing process for making a jet impingement cooling assembly, in accordance with example embodiments described herein. In FIG. 2, operations 202-210 are illustrated as separate, ordered, sequential operations. However, it will be appreciated that in various example manufacturing processes, the operations 202-210 may be performed in a different order than that shown and/or may be executed partially or completely in parallel. Moreover, additional or alternative operations may be included, and/or one or more operations may be omitted.

In the example of FIG. 2, the inlet chamber 112 configured to receive the inlet fluid flow 114 may be formed (202). The jet plate 108 having a plurality of jet nozzles 110 formed therein and coupled to the inlet chamber 112 may be formed, and positioned to direct the jet fluid portion 1116 of the inlet fluid flow 114 from the inlet chamber 112 through the jet nozzles 110 (204). The outlet chamber 126 may be formed that is positioned to receive the jet fluid portion 116 (as the jet fluid portion 124) once the jet fluid portion 116 has passed through the jet nozzles 110 (206). At least one bypass nozzle 120 may be formed in fluid connection with the inlet chamber 112 and configured to direct the bypass fluid portion 118 of the inlet fluid flow 114 into the outlet chamber 126 with the jet fluid portion 124 to thereby define an outlet fluid flow 115.

At least one semiconductor power module 122 may be sealed to the heat exchange base 102 that contains the inlet chamber 112, the outlet chamber 126, the jet plate 108, the at least one bypass nozzle 120, and the jet nozzles 110 (210). For example, the adhesive 136 may be used to seal the at least one semiconductor power module 122 to the heat exchange base 102. In example implementations, the separate mounting member 134 may additionally or alternatively sealed to the semiconductor power module 122, and/or to the heat exchange base 102.

As referenced herein, the process of FIG. 2 may be performed using injection molding and/or 3D printing, e.g., using any suitable plastic or other polymer. The various components may thus be formed integrally to some extent, or may be formed separately and then attached using a suitable adhesive or other sealant, as described herein. The various configurations described herein, including any desired variation in size, position, or number of the jet nozzles 110, may be manufactured inexpensively and quickly. Moreover, the various sealed components may be used reliably during subsequent jet impingement cooling, without a need for the types of o-rings, gaskets, and/or fasteners used in conventional systems.

Thus, the devices and methods of FIGS. 1 and 2 provide, with desired levels of velocity and pressure, a cooling liquid with high accuracy and/or precision to identified hotspots of semiconductor power modules. For example, described jet impingement cooling assembly embodiments provide direct contact of a cooling fluid to a backside of a substrate (e.g., direct bonded copper (DBC) substrate (e.g., a substrate including a dielectric disposed between a pair of metal layers for traces and/or bonding)) being cooled.

The described jet impingement heat exchange (cooling) assembly embodiments may be configured to provide either uniform or customized pressure(s) at each of one or more jet nozzles 110, to thereby provide uniform cooling to a corresponding plurality of hotspots. The jet impingement cooling assembly is efficient, in that jet impingement occurs at least at (e.g., only at) the desired and necessary hotspots.

Figure 3A:
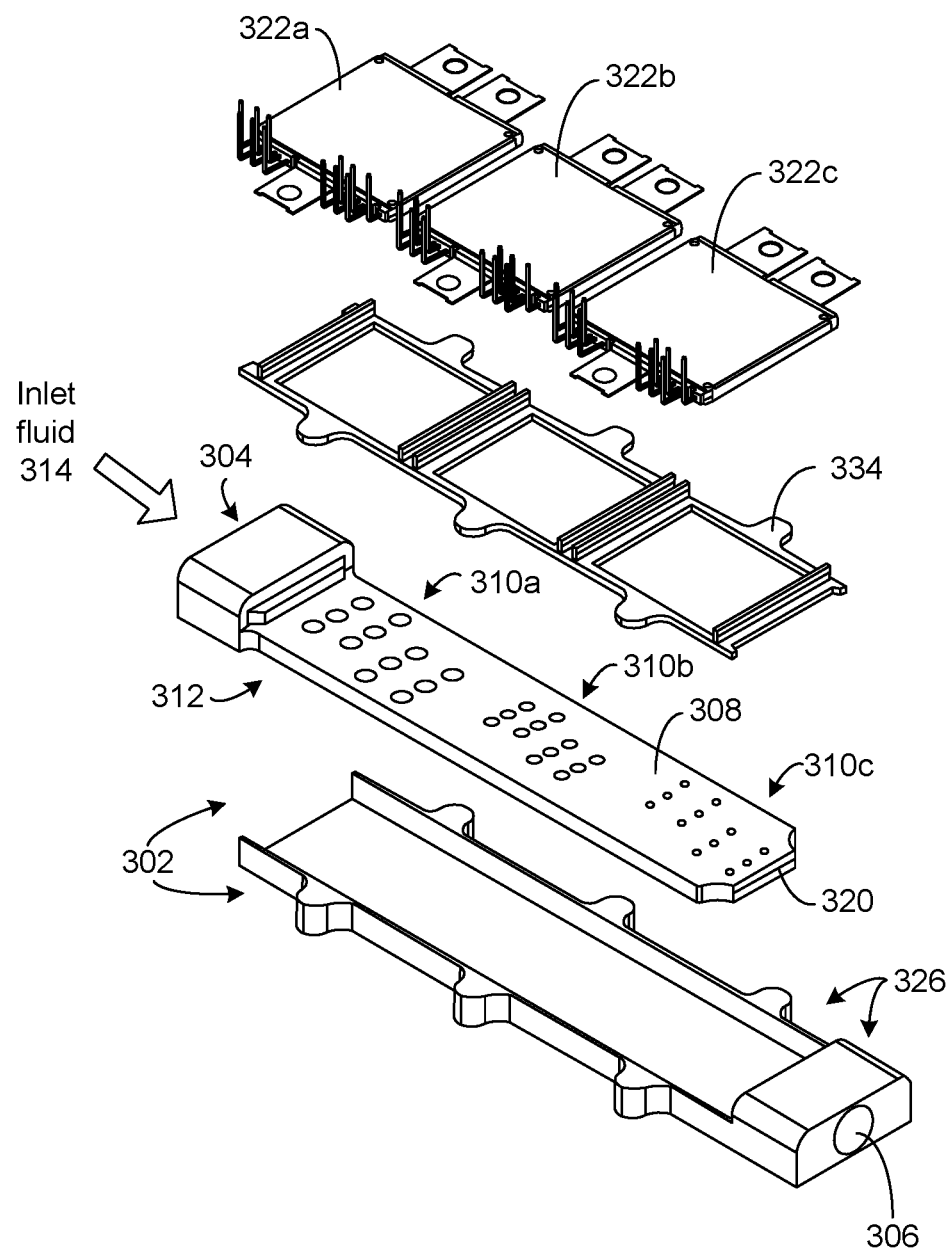
FIG. 3A is an exploded view of a first example embodiment of the jet impingement cooling assembly of FIG. 1.

For example, FIG. 3A is an exploded view of a first example embodiment of the jet impingement cooling assembly of FIG. 1. In FIG. 3A, a heat exchange base 302 includes an inlet connection 304, which may be in fluid contact with a fluid pump, as described above, to receive an inlet fluid flow 314. The heat exchange base 302 also includes an outlet connection 306. That is, as referenced above, the heat exchange base 302 for jet impingement cooling may be only part of a fluid loop used within a larger setting (e.g., within an automobile or other vehicle) to provide fluid-based heat dissipation to multiple components.

A jet plate 308 may be positioned within the heat exchange base 302. Multiple jet nozzles 310 may be formed within the jet plate 308. The jet plate 308 may be sealed to an inlet chamber 312, e.g., may be formed integrally with the inlet chamber 312 (e.g., using injection molding or 3D printing techniques).

The inlet fluid flow 314 may be maintained through the inlet connection 304 and into the inlet chamber 312. Within the inlet chamber 312, the inlet fluid flow 314 is divided into a jet fluid portion and a bypass fluid portion (not shown in FIG. 3A, but illustrated above in FIG. 1), so that a jet fluid portion may be directed through the jet nozzles 310 into an outlet chamber 326, while bypass fluid portion may be directed through at least one bypass nozzle 320 to the outlet chamber 326. Upon exiting the bypass nozzle 320, the bypass fluid portion may thus rejoin the jet fluid portion within the outlet chamber 326 and provide a total outlet fluid flow through the outlet connection 306.

The jet nozzles 310 may be sized, spaced, and positioned to provide a substantially uniform pressure along a length of the jet plate 308. For example, as shown, the jet nozzles 310 may include at least a subset of jet nozzles with diameters that decrease in a direction of the inlet fluid flow. For example, the jet nozzles 310 may include a first group of jet nozzles 310a, a second group of jet nozzles 310b, and a third group of jet nozzles 310c. As also shown, the jet nozzles 310b are smaller in diameter than the jet nozzles 310a, while the jet nozzles 310c are smaller in diameter than the jet nozzles 310b. Consequently, even though jet fluid portion through the inlet chamber 312 may decrease in pressure and velocity along a length of the jet plate 308, the successively smaller groups of jet nozzles 310a, 310b, 310c may cause jet fluid portions emitted from the groups of jet nozzles 310a, 310b, 310c to have substantially the same or similar velocities and pressures.

Further in FIG. 3A, the jet plate 308 forms a sealed connection with the inlet chamber 312, so that the jet fluid portion of the inlet fluid flow 314 received by way of the inlet connection 304 is forced through the jet nozzles 310 to provide jet fluid portion to be impinged upon semiconductor power modules 322a, 322b, 322c, in order to dissipate heat generated by operations of the semiconductor power module 322a, 322b, 322c.

The semiconductor power modules 322a, 322b, 322c may be mounted to the heat exchange base 302 using a mounting member 334. The semiconductor power modules 322a, 322b, 322c may be sealed using an appropriate adhesive (not shown in FIG. 3A) to the mounting member 334, and the mounting member 334 may be sealed using the same or different adhesive to a surface of the heat exchange base 302.

The semiconductor power modules 322a, 322b, 322c may include a circuit board(s) or other assembly of a plurality of semiconductor chips, or other devices. As referenced above, and illustrated in FIG. 1, the heat exchange base 302 may be configured to receive the semiconductor power modules 322a, 322b, 322c, so that the jet nozzles 310 may be positioned to be directly below devices of the semiconductor power modules 322a, 322b, 322c. Consequently, the inlet fluid flow 314 from the inlet connection 304 may be divided into a jet fluid portion and bypass fluid portion, with the jet fluid portion thereby being forced through the jet nozzles 310 to impinge directly onto corresponding backsides of devices of the semiconductor power modules 322a, 322b, 322c.

Following this jet impingement onto the devices of the semiconductor power modules 322a, 322b, 322c, the jet fluid portion may flow directly into the outlet chamber 326. The jet fluid portion may proceed into the outlet chamber 326 and rejoin with the bypass fluid portion directed through the bypass nozzle 320, to thereby provide a total outlet fluid flow through the outlet connection 306. In this way, the outlet fluid flow may thereby be provided to other elements being cooled, and ultimately return to the fluid pump being used.

Figure 3B:
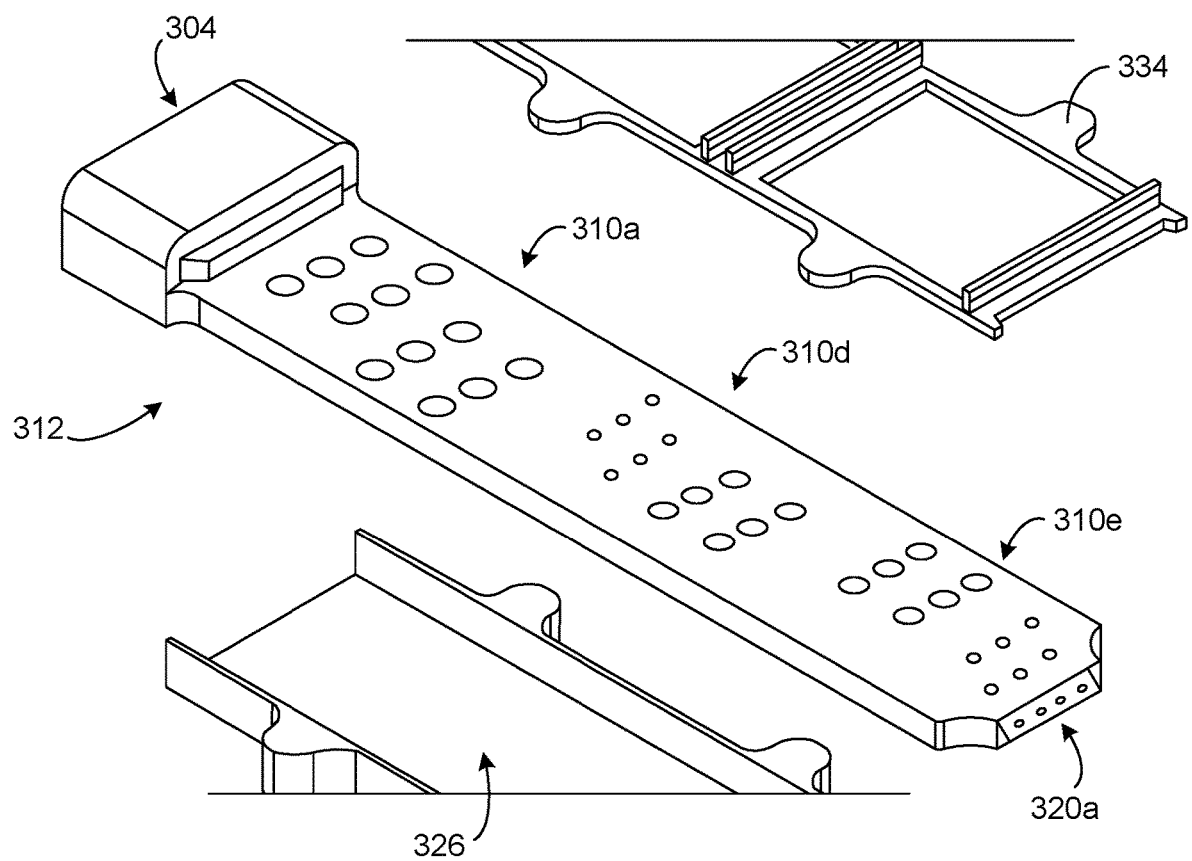
FIG. 3B illustrates an alternate example implementation of a jet plate of FIG. 3A.

FIG. 3B illustrates an alternate example implementation of a jet plate of FIG. 3A. In FIG. 3B, the jet nozzles 310 are customized to obtain desired results with respect to jet fluid portions through the jet nozzles 310. As shown, the group of jet nozzles 310a may be the same as in FIG. 3A, but a group of jet nozzles 310d includes some jet nozzles having a smaller diameter than the jet nozzles 310b of FIG. 3A, or than other jet nozzles of the group of jet nozzles 310d. Similarly, a group of jet nozzles 310e includes some jet nozzles having a larger diameter than the jet nozzles 310c of FIG. 3A, or than other jet nozzles of the group of jet nozzles 310e.

In other words, FIG. 3A illustrates an example in which at least a first subset of nozzle sizes are generally reduced in a direction of flow in order to maintain (substantially) uniform jet velocity on all impinging surfaces. In contrast, in FIG. 3B, nozzles sizes are customized so that desired levels of velocity/pressure (and associated extent(s) of cooling) at each group of nozzles may be obtained. In other words, at least a second subset of the jet nozzles may have diameters that increase in a direction of the inlet fluid flow.

For example, in FIG. 3B, it may occur that two devices are positioned above the group of nozzles 310d, of which a first device is positioned closer to the group of jet nozzles 310a and happens to require a relatively high degree of cooling, while a second device is positioned farther from the group of jet nozzles 310a (in a direction of the fluid flow) and happens to require a similar degree of cooling as a device(s) positioned above the group of jet nozzles 310a. Consequently, as shown, a first group of jet nozzles of the jet nozzles 310d are smaller in diameter to provide the desired increase in pressure/velocity/cooling, while a second group jet nozzles of the jet nozzles 310d are larger than the first group, but smaller than the group of jet nozzles 310a so as so maintain a similar velocity/pressure/cooling profile as that provided by the group of jet nozzles 310a (as described above with respect to FIG. 3A).

Also in FIG. 3B, the at least one bypass nozzle 320 of FIG. 3 is illustrated as including four bypass nozzles 320a. More generally, the bypass nozzle 320 may be configured to include any desired and suitable number and arrangement of bypass nozzles. As with the jet nozzles 310, diameters and other parameters of the bypass nozzles may be customized to obtain a desired outcome with respect to cooling the semiconductor power modules 322a, 322b, 322c, or desired outcomes with respect to other system parameters (e.g., with respect to a permissible level of erosion over time that may occur with respect to a metal coating on an underside(s) of the semiconductor power modules 322a, 322b, 322c).

Figure 4:
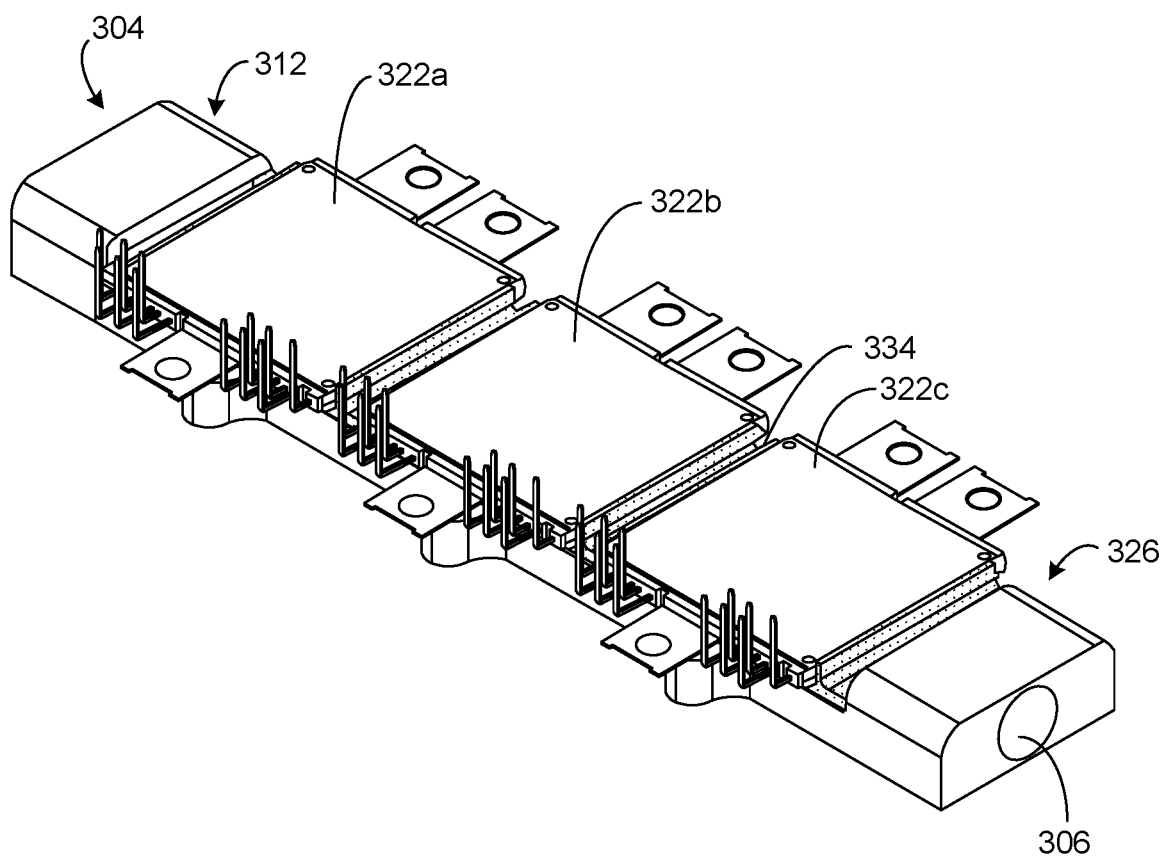
FIG. 4 is an assembled view of the examples of FIGS. 3A and 3B.

FIG. 4 is an assembled view of the examples of FIGS. 3A and 3B. As shown in FIG. 4, described techniques enable a compact, secure, customizable, and reliable cooling assembly.

Figure 5:
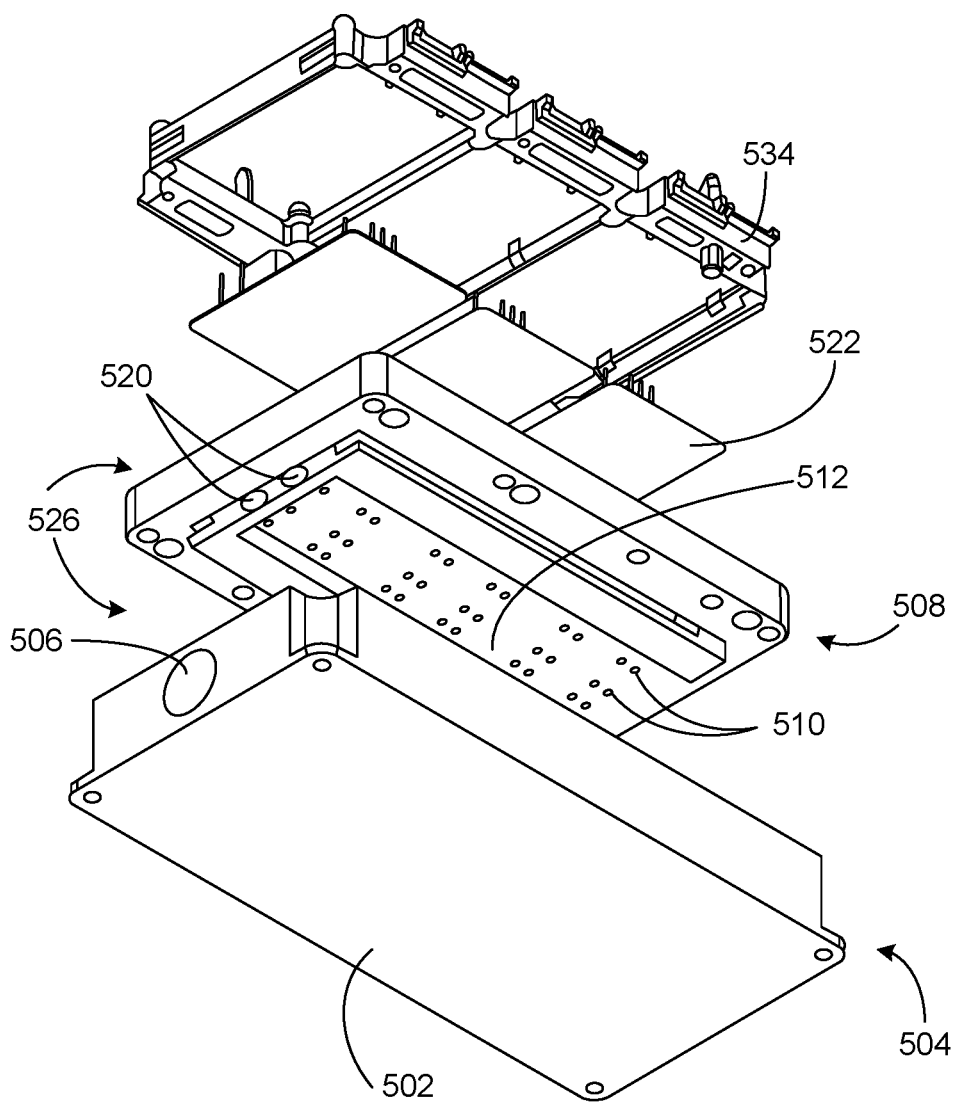
FIG. 5 is an exploded view of an alternate example implementation of the jet impingement cooling assembly of FIG. 1.
Figure 6:
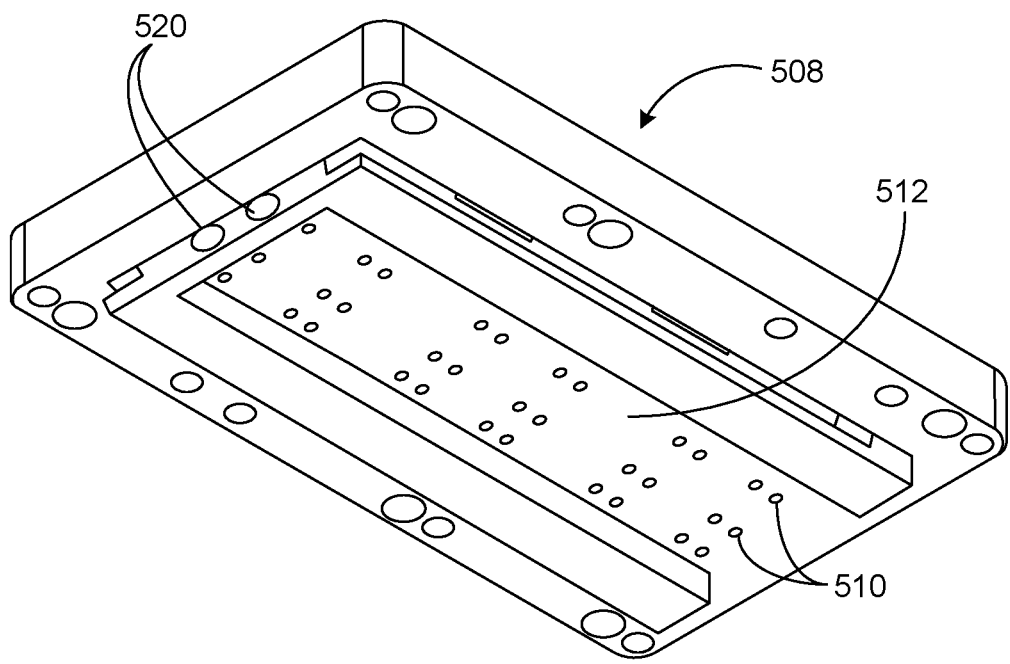
FIG. 6 is a bottom view of a jet plate of the implementation of FIG. 5.

FIG. 5 is an exploded view of an alternate example implementation of the jet impingement cooling assembly of FIG. 1. FIG. 6 is a bottom view of a jet plate of the implementation of FIG. 5. FIG. 7 is a top view of the jet plate of the implementation of FIG. 6.

In FIG. 5, a heat exchange base 502 includes an inlet connection 504 (indicated but not visible in FIG. 5) and an outlet connection 506. A jet plate 508 may be insertable into the heat exchange base 502. Multiple jet nozzles 510 may be formed within the jet plate 508. An inlet chamber 512 may be defined by insertion of the jet plate 508 into the heat exchange base 502.

During operation, as described above, an inlet fluid flow may thus be maintained through the inlet connection 504 and into the inlet chamber 512. As also described, the inlet fluid flow 514 may be divided into a jet fluid portion and a bypass fluid portion, so that a jet fluid portion may be directed through the jet nozzles 510 into an outlet chamber 526, while bypass fluid portion may be directed through two bypass nozzles 520 to the outlet chamber 526. Upon exiting the bypass nozzle 520, the bypass fluid portion may thus rejoin the jet fluid portion within the outlet chamber 526 and provide a total outlet fluid flow through the outlet connection 506.

In some implementations, the jet plate 508 may be adhered to the heat exchange base 502 to form a sealed connection that defines the inlet chamber 512, so that the jet fluid portion of the inlet fluid flow received by way of the inlet connection 504 is forced through the jet nozzles 510 to provide jet fluid portion to be impinged upon semiconductor power modules 522.

The semiconductor power modules 522 may be mounted to the jet plate 508 and/or the heat exchange base 502 using a mounting member 534. For example, the semiconductor power modules 522 may be sealed using an appropriate adhesive 736, as shown in FIG. 7, between the jet plate 508 and the semiconductor power modules 522 and/or the mounting member 534.

Figure 7:
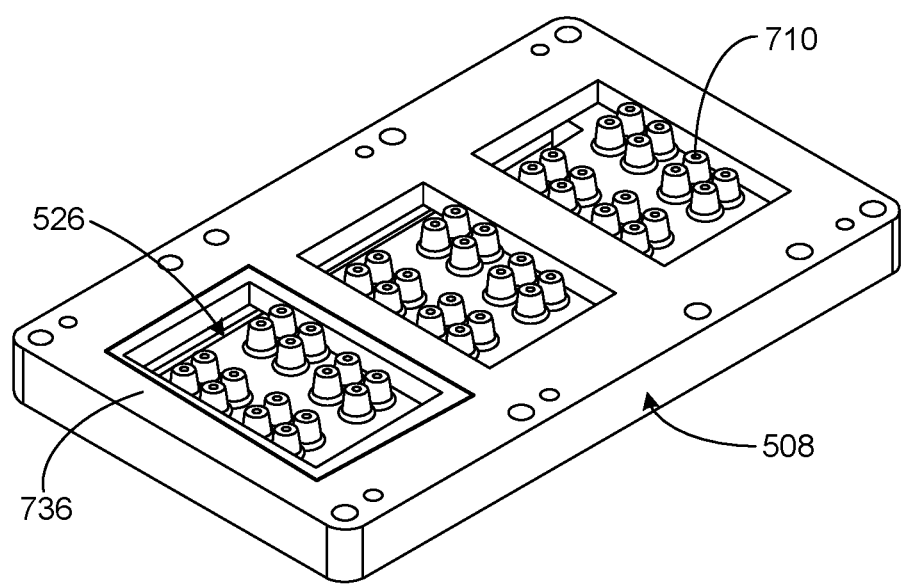
FIG. 7 is a top view of the jet plate of the implementation of FIG. 6.

FIG. 7 further illustrates that the jet nozzles 510 may include, or be connected to, jet nozzles 710. As shown, the jet nozzles 710 may be sized and positioned to define a fluid return path within part of the outlet chamber 526 that provides the outlet fluid flow that rejoins with the bypass fluid portion through the two bypass nozzles 520, to thereby provide the total outlet fluid flow through the outlet connection 506.

FIG. 8 illustrates a table demonstrating example pressures and thermal responses for various example implementations of the jet impingement cooling assembly of FIG. 1. In the table of FIG. 8, a column 802 includes example thermal resistance values, while a column 804 includes example pressure drops. Columns 806 include various bypass flow parameters, including a column 808 indicating a number of bypass nozzles included, column 810 indicating a diameter of each bypass nozzle, and a column 812 indicating an inlet flow rate.

In FIG. 8, example values of thermal resistance in column 802 are shown as approximate ratios determined with respect to a base value shown as "Y". Similarly, example values of pressure drop in column 804 are shown as approximate ratios determined with respect to a base value shown as "X".

As shown in example row 814, a low thermal resistance may be achieved in the example while retaining a suitably low pressure drop, by including 4 bypass nozzles, each having a diameter of 1.5 mm at a flow rate of 8 liters per minute. Of course, FIG. 8 is a non-limiting example, and actual implementation values will depend on many factors assumed (and held constant) for the example of FIG. 8, such as, e.g., a size, number, and/or positioning of jet nozzles.

More generally, all of the preceding examples are non-limiting, and many variations may be implemented. For example, a profile on a jet plate top surface may be parallel to a backside surface of a semiconductor power module being cooled, or may have a sloped surface, to produce either accelerating or decelerating fluid flow. In other examples, although the various inlet connections and outlet connections are illustrated as being located on opposed sides of a heat exchange base (e.g., to define a substantially linear fluid flow), other example implementations may provide inlet and outlet connections adjacent to one another on a single wall of a heat exchange base, or on adjacent sidewalls of a heat exchange base.

Described techniques reduce a complexity and cost of implementing jet impingement cooling systems, while increasing a reliability of such systems. Further, potential erosion/corrosion of metal coatings may be reduced or eliminated, e.g., by controlling a fluid jet velocity of impinging fluid flows. Additionally, pressure drops across a jet impingement cooling system may be reduced in an adjustable, configurable manner.

In specific examples, using polymers as described herein also simplifies manufacturability and lowers material costs of impingement cooling housing/components. Using adhesives as a seal(s) in impingement cooling systems eliminates o-rings, gaskets, and fasteners used in conventional systems.

In specific examples, the described jet impingement cooling assembly may be used for cooling in the context of automobile or other engine applications, including electric vehicles. Such applications often have high power requirements within high-heat environments, while also meeting safety mandates. In other implementations, described techniques can be used in, e.g., wind turbine electronics, rail, and industrial drives.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A jet impingement cooling assembly for semiconductor devices, comprising:
    an inlet chamber configured to receive an inlet fluid flow;
    a jet plate having jet nozzles formed therein and coupled to the inlet chamber, and positioned to direct a jet fluid portion of the inlet fluid flow from the inlet chamber through the jet nozzles;
    an outlet chamber positioned to receive the jet fluid portion once the jet fluid portion has passed through the jet nozzles; and
    at least one bypass nozzle in fluid connection with the inlet chamber and configured to direct a bypass fluid portion of the inlet fluid flow into the outlet chamber with the jet fluid portion to thereby define an outlet fluid flow.

2. The jet impingement cooling assembly for semiconductor devices of claim 1, wherein the jet nozzles include at least a first subset of jet nozzles with diameters that decrease in a direction of the inlet fluid flow.

3. The jet impingement cooling assembly for semiconductor devices of claim 2, wherein the jet nozzles include at least a second subset of jet nozzles with diameters that increase in the direction of the inlet fluid flow.

4. The jet impingement cooling assembly for semiconductor devices of claim 1, wherein the at least one bypass nozzle includes at least two bypass nozzles.

5. The jet impingement cooling assembly for semiconductor devices of claim 1, wherein at least one of the inlet chamber, the jet plate, or the outlet chamber includes polymer.

6. The jet impingement cooling assembly for semiconductor devices of claim 1, further comprising a heat exchange base configured to receive a semiconductor module including at least one semiconductor device with a frontside facing away from the inlet chamber and a backside facing the jet plate.

7. The jet impingement cooling assembly for semiconductor devices of claim 6, wherein the jet plate is positioned to cause jet impingement of the jet fluid portion through the jet nozzle and onto the backside of the at least one semiconductor device.

8. The jet impingement cooling assembly for semiconductor devices of claim 6, wherein the semiconductor module is sealed to the heat exchange base using an adhesive.

9. The jet impingement cooling assembly for semiconductor devices of claim 6, further comprising a mounting member configured to receive the semiconductor module and to be mounted on the heat exchange base.

10. The jet impingement cooling assembly for semiconductor devices of claim 9, wherein the semiconductor module is sealed to the mounting member using at least one adhesive and the mounting member is sealed to the heat exchange base using the at least one adhesive.

11. A jet plate assembly for jet impingement cooling of a semiconductor device, comprising:
    a jet plate having jet nozzles and at least one bypass nozzle formed therein, and configured to be received within a heat exchange base; and
    wherein the jet plate, when received within the heat exchange base, divides a fluid flow path of an inlet fluid flow received at an inlet chamber of the heat exchange base into a jet fluid portion passing through the plurality of jet nozzles into an outlet chamber of the heat exchange base, and a bypass fluid portion passing through the at least one bypass nozzle into the outlet chamber, to thereby define an outlet fluid flow that includes the bypass fluid portion and the jet fluid portion.

12. The jet plate assembly of claim 11, wherein at least one of the inlet chamber, the jet plate, the heat exchange base, or the outlet chamber includes polymer.

13. The jet plate assembly of claim 11, wherein the heat exchange base is configured to receive a semiconductor module including at least one semiconductor device with a frontside facing away from the inlet chamber and a backside facing the jet plate.

14. The jet plate assembly of claim 13, wherein the jet plate is positioned to cause jet impingement of the jet fluid portion through the jet nozzle and onto the backside of the at least one semiconductor device.

15. The jet plate assembly of claim 13, wherein the semiconductor module is sealed to the heat exchange base using an adhesive.

16. The jet plate assembly of claim 13, further comprising a mounting member configured to receive the semiconductor module and to be mounted on the heat exchange base, wherein the semiconductor module is sealed to the mounting member using at least one adhesive and the mounting member is sealed to the heat exchange base using the at least one adhesive.

17. A method of making a jet impingement cooling assembly for semiconductor devices, comprising:
    forming an inlet chamber configured to receive an inlet fluid flow;
    forming a jet plate having a plurality of jet nozzles formed therein and coupled to the inlet chamber, and positioned to direct a jet fluid portion of the inlet fluid flow from the inlet chamber through the jet nozzles;
    forming an outlet chamber positioned to receive the jet fluid portion once the jet fluid portion has passed through the jet nozzles; and
    forming at least one bypass nozzle in fluid connection with the inlet chamber and configured to direct a bypass fluid portion of the inlet fluid flow into the outlet chamber with the jet fluid portion to thereby define an outlet fluid flow.

18. The method of claim 17, further comprising:
    sealing at least one semiconductor power module to a heat exchange base that contains the inlet chamber, the outlet chamber, the jet plate, the at least one bypass nozzle, and the jet nozzles.

19. The method of claim 18, further comprising:
mounting the at least one semiconductor power module onto a mounting member; and
sealing the at least one semiconductor power module to the heat exchange base by sealing the mounting member to the heat exchange base.

20. The method of claim 18, wherein at least one of the inlet chamber, the jet plate, the heat exchange base, or the outlet chamber includes polymer.

* * * * *